(12) United States Patent
Jeon et al.

(10) Patent No.: US 10,919,396 B2
(45) Date of Patent: Feb. 16, 2021

(54) SOLAR PANEL AND CAR ROOF

(71) Applicant: LG Electronics Inc., Seoul (KR)

(72) Inventors: Joonho Jeon, Seoul (KR); Jungguen Kim, Seoul (KR); Yong Song, Seoul (KR); Jeonghun Woo, Seoul (KR); Eonjoo Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 114 days.

(21) Appl. No.: 15/678,722

(22) Filed: Aug. 16, 2017

(65) Prior Publication Data

US 2018/0050594 A1 Feb. 22, 2018

(30) Foreign Application Priority Data

Aug. 17, 2016 (KR) .................... 10-2016-0104394

(51) Int. Cl.
| | | |
|---|---|---|
| *H02S 40/38* | (2014.01) | |
| *B60L 8/00* | (2006.01) | |
| *F24S 25/20* | (2018.01) | |
| *F24S 25/63* | (2018.01) | |
| *H01L 31/049* | (2014.01) | |
| *H01L 31/048* | (2014.01) | |
| *H02S 40/34* | (2014.01) | |

(Continued)

(52) U.S. Cl.
CPC .............. *B60L 8/003* (2013.01); *B60K 16/00* (2013.01); *F24S 25/20* (2018.05); *F24S 25/63* (2018.05); *H01L 31/048* (2013.01); *H01L 31/049* (2014.12); *H02S 30/10* (2014.12); *H02S 40/34* (2014.12); *H02S 40/38* (2014.12); *B60K 2016/003* (2013.01); *Y02E 10/50* (2013.01)

(58) Field of Classification Search
CPC ...... F24J 2/5211; F24J 2/5252; H01L 31/048; H01L 31/0488; H01L 31/049; H02S 10/40; F24S 25/63; F24S 25/20
See application file for complete search history.

(56) References Cited

U.S. PATENT DOCUMENTS 4,456,782 A * 6/1984 Nishiura ........... H01L 31/02021
136/244
6,034,320 A 3/2000 Malcherczyk et al.
(Continued)

FOREIGN PATENT DOCUMENTS

| JP | 2009-246022 A | 10/2009 |
|---|---|---|
| KR | 10-2015-0013669 A | 2/2015 |
| WO | WO 2014/050004 A1 | 4/2014 |

OTHER PUBLICATIONS

Machine translation of WO 2014/050004 A1; accessed and printed Feb. 19, 2020 (Year: 2014).*

*Primary Examiner* — Edward J. Schmiedel
(74) *Attorney, Agent, or Firm* — Birch, Stewart, Kolasch & Birch, LLP (57) ABSTRACT

A solar panel can include at least one solar cell having a first surface and a second surface facing in mutually opposing directions; a first substrate disposed on the first surface of the at least one solar cell; a first encapsulant disposed between the first substrate and the at least one solar cell; a second substrate disposed on the second surface; and a second encapsulant disposed between the second substrate and the at least one solar cell, in which the second substrate includes a steel plate or fiber reinforced plastic.

8 Claims, 5 Drawing Sheets

(51) Int. Cl.
*B60K 16/00* (2020.01)
*H02S 30/10* (2014.01)

(56) References Cited

U.S. PATENT DOCUMENTS

| | | | |
|---|---|---|---|
| 6,323,416 B1* | 11/2001 | Komori | B32B 17/04 |
| | | | 136/259 |
| 2003/0000568 A1* | 1/2003 | Gonsiorawski | B32B 17/10018 |
| | | | 136/251 |
| 2007/0125417 A1 | 6/2007 | Johanson et al. | |
| 2011/0226312 A1* | 9/2011 | Bohm | B32B 15/08 |
| | | | 136/251 |
| 2014/0041714 A1* | 2/2014 | Van Den Berg | B29C 70/088 |
| | | | 136/251 |
| 2014/0083481 A1* | 3/2014 | Hebrink | H02S 20/26 |
| | | | 136/246 |
| 2015/0136207 A1 | 5/2015 | Giron et al. | |
| 2015/0197150 A1 | 7/2015 | Shirai | |
| 2015/0287861 A1* | 10/2015 | Sato | H01L 31/048 |
| | | | 136/251 |
| 2015/0311861 A1* | 10/2015 | Nam | H02S 40/32 |
| | | | 136/251 |

* cited by examiner

SOLAR PANEL AND CAR ROOF

CROSS-REFERENCE TO RELATED APPLICATION

Pursuant to 35 U.S.C. § 119(a), this application claims the benefit of earlier filing date and right of priority to Korean Application No. 10-2016-0104394, filed in the Republic of Korea on Aug. 17, 2016, the contents of which is incorporated by reference herein in its entirety.

BACKGROUND OF THE INVENTION

Field of the Invention

The present disclosure relates to a solar panel applicable to a car roof and a car roof employing the solar panel.

Background of the Invention

A solar cell is configured to convert light energy into electric energy. In general, a solar cell includes a P type semiconductor and an N type semiconductor, and when the solar cell receives light, electric charges migrate to cause a potential difference.

When a solar cell is applied to a car roof or an interior/exterior material of a building, the solar cell may produce electric energy using indoor light supplied from a fluorescent lamp or a light emitting diode (LED) or natural light supplied from the sun. In particular, when a solar cell is applied to a car, electric power required for the car may be produced without consuming fuel.

In the related art, in order to apply a solar cell to a car roof, a method for prefabricating a solar panel including solar cells and fixing the solar panel to a car using a mechanical fixing structure is used. Such a related art method, however, has limitations in that a defect may occur during a process of fixing the solar panel and waterproofing is not perfect, as well as a limitation that a separate mechanical fixing structure is additionally required to fix the solar panel to a car.

SUMMARY OF THE INVENTION

Therefore, an aspect of the detailed description is to provide a solar panel having a structure not requiring a separate mechanical fixing structure for fixing the solar panel to a car (or vehicle), and a car roof employing the solar panel.

Another aspect of the detailed description is to provide a solar panel having a structure capable of reducing a defect possibility during a process of fixing the solar panel to a car, and a car roof employing the solar panel.

Another aspect of the detailed description is to provide a solar panel having a structure capable of securing reliability in the long term by alleviating an impact due to vibrations transmitted from a car, and a car roof employing the solar panel.

Another aspect of the detailed description is to provide a solar panel having a structure capable of solving a waterproofing problem and a car roof employing the solar panel.

To achieve these and other advantages and in accordance with the purpose of this specification, as embodied and broadly described herein, a solar panel includes a first substrate positioned on a first surface of a solar cell and a second substrate positioned on a second surface of the solar cell, and the second substrate is formed of a steel plate or fiber reinforced plastic. The second substrate can be used as a roof panel of a car. A first encapsulant can be disposed between the first substrate and the solar cell and a second encapsulant can be disposed between the second substrate and the solar cell.

The first substrate can form an appearance of the car and can be formed of at least one of glass, polycarbonate (PC), and a transparent sheet.

The second substrate can include a first part and a second part, and the second part is lower than the first part and is connected to the first part. The second encapsulant, the solar cell, the first encapsulant, and the first substrate are sequentially stacked on the second part to form a multilayer structure, and an upper surface of the first substrate can have the same height as that of the first part.

The first substrate can have the same area as that of the second part, and at least one of the first encapsulant and the second encapsulant can be adhered to the entire adhering surface of the first substrate or the entire adhering surface of the second substrate to have the same area as that of the second part to thus prevent water leak.

To achieve these and other advantages and in accordance with the purpose of this specification, as embodied and broadly described herein, a car roof is provided. The car roof includes a substrate positioned on a first surface of a solar cell and a roof panel positioned on a second surface of the solar cell. The roof panel can be formed of a steel plate or fiber reinforced plastic. A first encapsulant can be disposed between the substrate and the solar cell and a second encapsulant can be disposed between the roof panel and the solar cell.

The substrate of the car roof can correspond to a first substrate of a solar panel, and a roof panel of the car roof can correspond to a second substrate of the solar panel. Thus, the substrate can be formed of at least one of glass, polycarbonate (PC), and a transparent sheet.

A hole can be formed in at least a portion of the roof panel, the car roof can include a bus ribbon electrically connected to a solar cell, and the bus ribbon can be connected to an electrical connection part of a car through the hole. Thus, electric power produced by the solar cell can be transmitted to the car.

The roof panel can include a first part forming an appearance of the car and a second part having a height lower than the first part and connected to the first part. The second encapsulant, the solar cell, the first encapsulant, and the substrate are sequentially stacked on the second part to form a multilayer structure, and an upper surface of the substrate can have the same height as that of the first part.

The substrate can have the same area as that of the second part, and at least one of the first encapsulant and the second encapsulant can be adhered to the entire adhering surface of the substrate or the entire adhering surface of the roof panel to have the same area as that of the second part.

The roof panel can have a curved surface, and the second encapsulant, the solar cell, the first encapsulant, and the substrate can be sequentially stacked on the second part to form a multilayer structure, having a curved surface corresponding to the roof panel.

Further scope of applicability of the present application will become more apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

Figure 1:
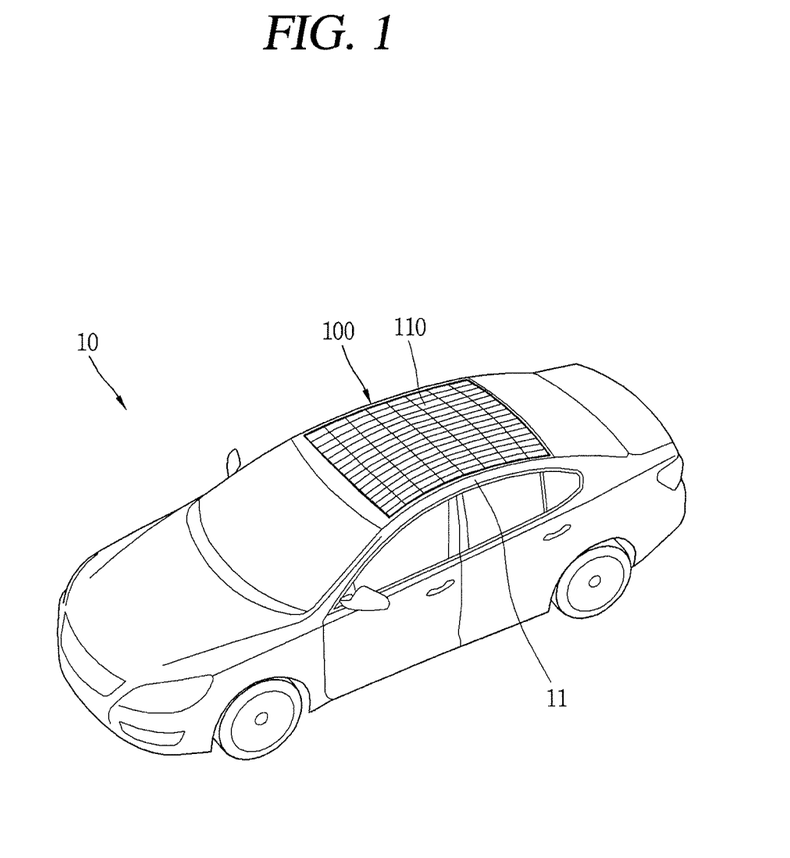
FIG. 1 is a partial perspective view illustrating a car roof of the present disclosure according to an embodiment.

FIG. 1 is a partial perspective view illustrating a car roof 100 of the present disclosure.

A car body of a car 10 is formed by a chassis 11, and a hole in which a car roof 100 can be installed is formed in the chassis 11. The car roof 100 is installed in the hole and forms an appearance, in particular, the roof, of the car 10. The car roof 100 of the present disclosure includes a solar cell 110 and is configured to produce electric power using natural light supplied from the sun.

A solar panel 200' and a car roof 300 described hereinafter are substantially the same and are not different objects. That is, a product before being applied to the car 10 may be termed the solar panel 200' and a product applied to the car 10 may be termed the car roof 300.

Figure 2:
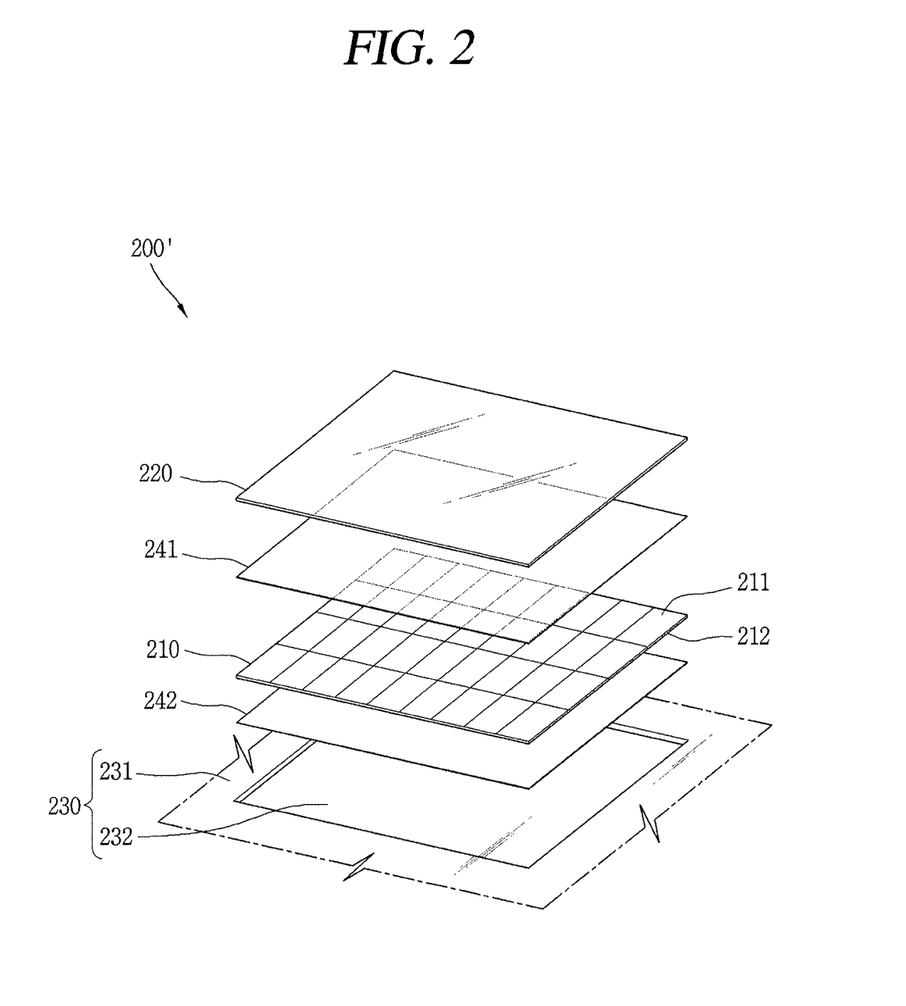
FIG. 2 is a conceptual view illustrating a solar panel of the present disclosure according to an embodiment.

FIG. 2 is a conceptual view illustrating the solar panel 200'.

The solar panel 200' includes at least one solar cell 210, a first substrate 220, a first encapsulant 241, a second substrate 230, and a second encapsulant 242. The solar panel 200' can have a structure in which the second substrate 230, a solar cell 210, and the first substrate 220 are sequentially stacked from below, and the first encapsulant 241 and the second encapsulant 242 are components for protecting and adhering the solar cell 210.

The solar panel 200' can have at least one solar cell 210. For example, One or a plurality of solar cells 210 can be provided depending on a design of the solar panel 200'. When a plurality of solar cells 210 are provided, each of the solar cells 210 can be disposed to be spaced apart from each other and can be connected to each other in series to form a string.

Each solar cell 210 has a first surface 211 and a second surface 212 facing in mutually opposite directions. Light can be received (or collected) through any one of the first surface 211 and the second surface 212 or through both of them. Here, the ordinal numbers such as first and second merely discriminate between elements without any particular technical meaning.

The first substrate 220 is positioned on the first surface 211 of the solar cell 210. When the solar panel 200' is applied to a car, the first substrate 220 forms an appearance of the car and is visually exposed to the outside of the car. The first substrate 220 forms an outermost layer of the solar panel 200' and is configured to protect the solar cell 210.

The first substrate 220 can be formed of a transparent material which does not block light incident to the solar cell 210. For example, the first substrate 220 can be formed of at least one of glass, polycarbonate, and a transparent sheet.

The second substrate 230 is positioned on the second surface of the solar cell 210. When the solar panel 200' is applied to a car, the second substrate 230 corresponds to a roof panel of the car. The roof panel is disposed on the roof of the car and forms a portion of the chassis. Since the second substrate 230 forms a portion of the chassis, the second substrate 230 can be formed of the same material as that of the chassis. For example, the second substrate 230 can be formed of a steel plate or fiber reinforced plastic. As the steel plate, an electrolytic galvanized iron (EGI) plated with zinc can be used to secure high tension. However, a material of the second substrate 230 is not limited thereto and any material used in a chassis of a car can be applied.

In order to prevent the inside of the car or the interior material of the car from being exposed visually, the second substrate 230 can be formed of an opaque material. However, the second substrate 230 can not necessarily be formed of an opaque material. If both the interior material of the car and the second substrate 230 are formed of a transparent material, the inside of the car can be disadvantageously visually exposed to the outside through the solar panel 200', but indoor light of the car can be supplied to the solar cell 210 and used to produce electric power. Here, light is received through both sides of the solar cell 210.

The first encapsulant 241 is disposed between the first surface 211 of the solar cell 210 and the first substrate 220 in order to adhere the first substrate 220 and the solar cell 210. The second encapsulant 242 is disposed between the second surface 212 of the solar cell 210 and the second substrate 230 to adhere the second substrate 230 and the solar cell 210.

The first encapsulant 241 and the second encapsulant 242 are formed of a material which can be melted and cured during a process of applying heat and pressure to adhere the first substrate 220 and the second substrate 230 to the solar cell 210. For example, the first encapsulant 241 and the second encapsulant 242 can be formed of at least one of ethylene vinyl acetate (EVA), polyolefine (PO), and polyvinyl butyral (PVB).

Figure 3:
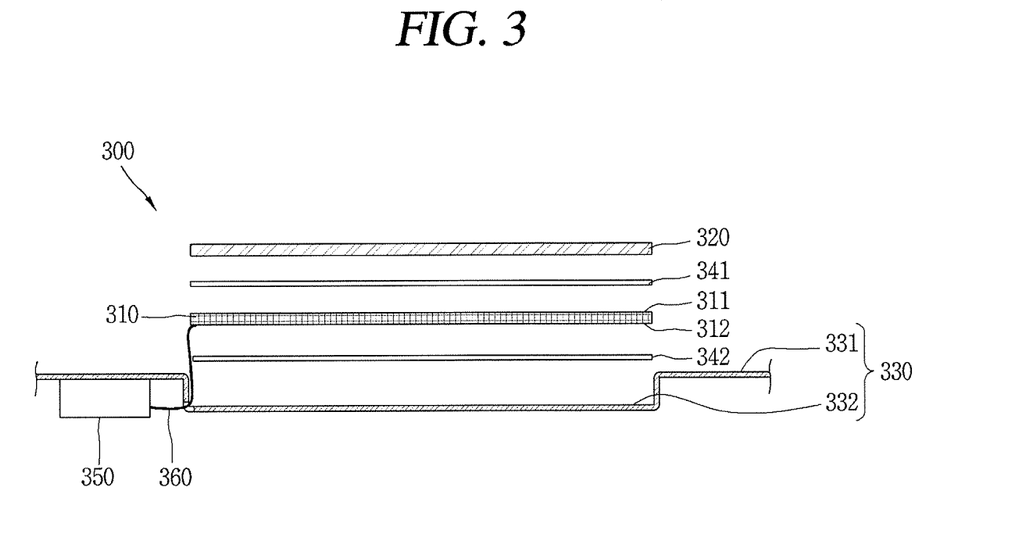
FIG. 3 is a cross-sectional view illustrating a car roof of the present disclosure according to an embodiment.

FIG. 3 is a cross-sectional view illustrating a car roof 300 of the present disclosure.

The car roof 300 is a concept of applying the solar panel 200' described above to a car. Thus, the same descriptions of the solar panel 200' can also be applied to the car roof 300 in the same manner.

The car roof 300 includes at least one solar cell 310, a substrate 320, a first encapsulant 341, a roof panel 330, and a second encapsulant 342. The car roof 300 has a structure in which the roof panel 330, the solar cell 310, and the substrate 320 are sequentially stacked from below, and the first encapsulant 341 and the second encapsulant 342 are components for protecting and adhering the solar cell 310. The substrate 320 corresponds to the first substrate 220 described above with reference to FIG. 2, and the roof panel 330 corresponds to the second substrate 230.

Here, only components not described in the solar panel 300 will be described and redundant descriptions will be omitted.

The roof panel 330 can include a first part 331 and a second part 332. The first part 331 forms an appearance of a car and is visually exposed to the outside of the car. The second part 332 is lower than the first part 331 and is connected to the first part 331. The second encapsulant 342, the solar cell 310, the first encapsulant 341, and the substrate 320 are sequentially stacked on the second part 332. An upper surface of the substrate 320 has the same height as that of the first part 331. Since there is no difference in height between the upper surface of the substrate 320 and the first part 331, although the car roof 300 including the solar cell 310 is applied to the car, an aesthetic feeling of the car in design may not be damaged or adversely impacted.

In order to form a uniform appearance of the car and prevent water leak, the substrate 320 can have the same area as that of the second part 332. Also, at least one of the first encapsulant 341 and the second encapsulant 342 can be adhered to an entire adhering surface of the substrate 320 or an entire adhering surface of the roof panel 330 such that the at least one of the first encapsulant 341 and the second encapsulant 342 can have the same area as that of the second part 332. The adhering surface of the substrate 320 can refer to a surface of the substrate 320 facing the solar cell 310, and the adhering surface of the roof panel 330 refers to a surface of the roof panel 330 facing the solar cell 310.

The configuration in which the encapsulants 341 and 342 are adhered to the entire adhering surface of the substrate 320 and adhered to the entire adhering surface of the roof panel 330 should be technically distinguished from a configuration in which the encapsulants 341 and 342 are adhered to only a portion of the substrate 320 or only a portion of the roof panel 330.

If the encapsulants 341 and 342 are adhered only to a portion of the substrate 320 or the roof panel 330, there may be a gap between the substrate 320 and the solar cell 310 or between the roof panel 330 and the solar cell 310 and water leak may occur through the gap. Here, water leak refers to an introduction of water to the inside of the car. However, when the encapsulants 341 and 342 are adhered to the entire adhering surface of the substrate 320 and the entire adhering surface of the roof panel 330, a gap of the car roof 300 can be eliminated and the problem of water leak can be solved.

The car roof 300 is an exterior material of the car, and thus, it is visually exposed to the outside of the car. Thus, in order to use electric power produced by the solar cell 310 in the car, an electric connection part 350 of the car and the solar cell 310 are required to be electrically connected. The electric connection part 350 of the car refers to a component electrically connected to a junction box of the car through an electric wiring.

The electric connection part 350 is positioned on a portion of the car roof, rather than a rear side of the car roof 300. The electric connection part 350 is preferably disposed between the exterior material and interior material of the car such that it is not visually exposed to the outside.

The car roof 300 has a bus ribbon 360 electrically connected to the solar cell 310. The bus ribbon 360 refers to a component electrically connecting the solar cell 310 and an external device to supply electric power produced by the solar cell 310. A hole is formed in at least a portion of the roof panel 330. The hole can be formed by partially cut out the roof panel 330. The bus ribbon 360 is disposed to pass through the hole of the roof panel 330 and electrically connected to the electric connection part 350 of the car. Through this structure, the bus ribbon 360 can transmit electric power to the car through the electric connection part 350, without being exposed to the inside of the car.

The roof panel 330 can be configured to have a curved surface according to a design of the car. When the roof panel 330 has a curved surface, since the second encapsulant 342, the solar cell 310, the first encapsulant 341, and the substrate 320 are also sequentially stacked on the second part 332, forming a multilayer structure which can also be curved to correspond to the roof panel 330.

The multilayer structure can be first formed, introduced to a furnace, and undergo through a process (lamination process) of applying heat and pressure to form the car roof 300, and thus, the roof panel 330 does not necessarily have a flat surface.

The car roof 300 can also be manufactured through an autoclave process. The autoclave process refers to a process of introducing the multilayer structure to an autoclave device and applying heat and pressure thereto to adhere the solar panel to the roof panel.

Descriptions of the car roof 300 can also be applied to the solar panel 200' described above in the same manner. For example, the configuration in which the second substrate 230 has the first part 231 (please refer to FIG. 2) and the second part 232 (please refer to FIG. 2), the configuration in which the upper surface of the first substrate 220 has the same height as that of the first part 231 of the second substrate 230, the configuration in which the hole is formed on the second substrate 230 and the button ribbon passes through the hole, the configuration in which the first encapsulant 241 and the second encapsulant 242 are adhered to the entire adhering surface of the first substrate 220 or the second substrate 230, and the like, can also be applied to the solar panel 200' in the same manner.

When a solar module having the structure in which glass is adhered to both sides of the solar cell 310 is prefabricated and the solar module is installed in the car roof, a separate mechanical fixing structure is required and a defect may occur during a mounting structure and water leak may occur. However, when the roof panel 330 is applied to the second substrate 230, a separate mechanical fixing structure is not required. This is because the second substrate 230 is the roof panel 330 of the car.

Also, since the car roof of the present disclosure includes the roof panel of the car, strength of the roof panel may be used as is. Thus, damage to the car roof during a process of mounting the car roof on the car can be effectively prevented.

In FIG. 3, reference numeral 311 denotes a first surface of the solar cell 310 and 312 denotes a second surface of the solar cell 310.

Hereinafter, another embodiment of the solar panel or car roof will be described.

Figure 4:
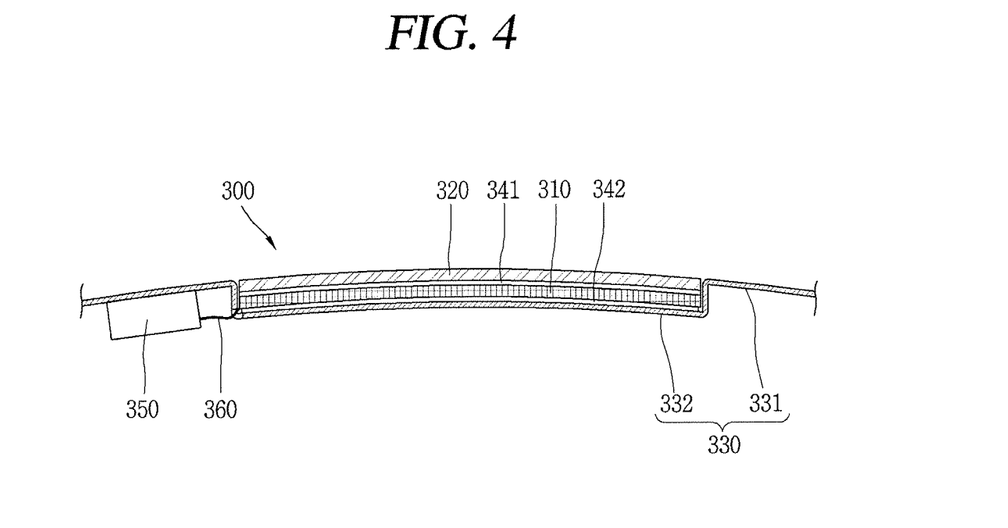
FIG. 4 is view illustrating a modification of the car roof of FIG. 3 according to an embodiment.

FIG. 4 is a modification of the car roof 300 illustrated in FIG. 3.

The car roof 300 is not required to be necessarily formed to have a flat surface and can have a curved surface depending on a design of the car. For example, the first part 331 and the second part 332 of the roof panel 330 can be formed to have a curved surface and the substrate 320 forming an appearance of the car roof can also be formed to have a curved surface.

Thus, the solar cell 310, the first encapsulant 341, and the second encapsulant 342 between the roof panel 330 and the substrate 310 can be disposed along the curved surface. Also, the car roof 300 as a complete product can form an appearance of a curved surface of the car.

In FIG. 4, reference numerals not described above can be referred to the descriptions of FIG. 3.

Figure 5:
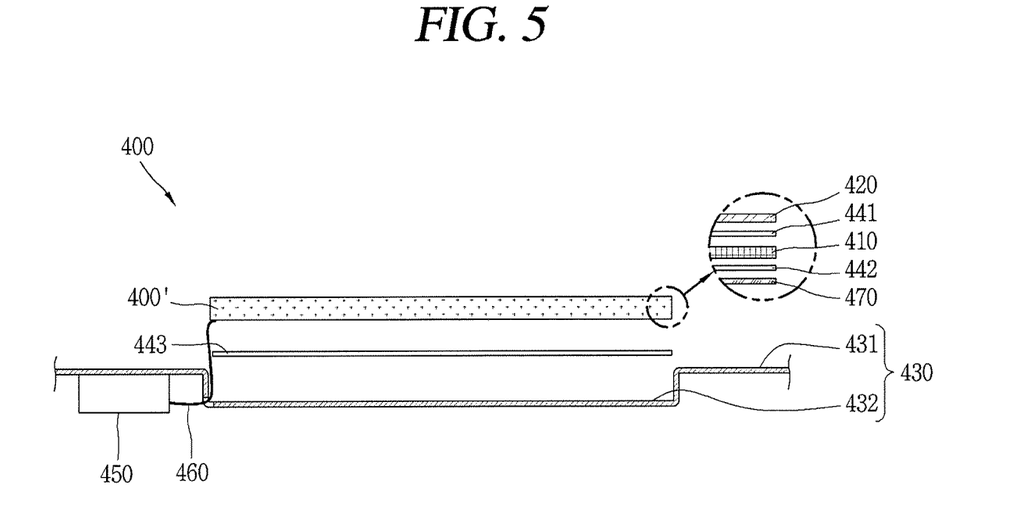
FIG. 5 is a cross-sectional view illustrating another embodiment of a car roof.

FIG. 5 is a cross-sectional view of another embodiment of a car roof 400.

A solar panel 400' is first manufactured and secondly mounted on a second part 432 of a roof panel 430 to form the car roof 400.

The first manufactured solar panel 400' includes a solar cell 410, a substrate 420, a first encapsulant 441, and a second encapsulant 442, and can further include a back sheet 470. The back sheet 470 is positioned on a second surface of the solar cell 410, and the second encapsulant 442 is disposed between the second surface of the solar cell 410 and the back sheet 470.

However, the back sheet 470 is optional and may be omitted. For example, the first manufactured solar panel 400' can have a structure in which the second encapsulant 442, the solar cell 410, the first encapsulant 441, and the substrate 420 are sequentially stacked.

Also, glass, instead of the back sheet 470, can also be included in the solar panel 400'. Here, the first manufactured solar panel 400' can have a structure in which glass, the second encapsulant 442, the solar cell 410, the first encapsulant 441, and the substrate 420 are sequentially stacked.

The first manufactured solar panel 400' can be mounted on the roof panel 430 including a first part 431 and a second part 432. A third encapsulant 443 can be additionally disposed between the back sheet 470 and the second part 432 of the roof panel 430. If the solar panel 400' does not include the back sheet 470, the second encapsulant 443 can be further provided to adhere the solar panel 400' to the roof panel 430. Here, two layers of second encapsulant 442 are disposed between the solar cell 410 and the second part 432 of the roof panel 430.

In cases where the car roof 400 includes an opaque back sheet 470, a bus ribbon 460 is covered by the back sheet 470 and is not visually exposed. Thus, when the car roof 400 includes the opaque back sheet 470, there is no limitation in a position of a hole for connection of the bus ribbon 460.

Figure 6:
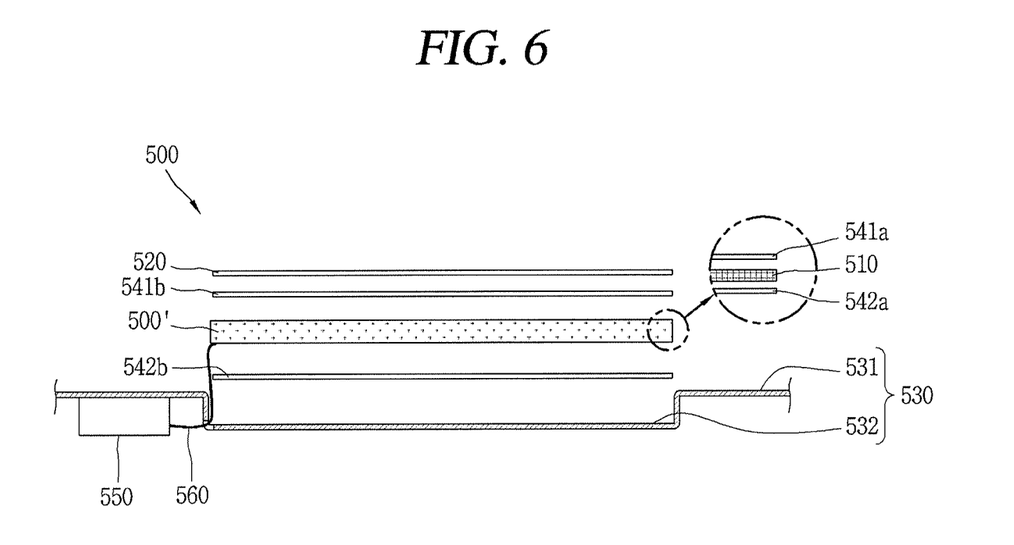
FIG. 6 is a cross-sectional view illustrating another embodiment of a car roof.

FIG. 6 is a cross-sectional view of another embodiment of a car roof 500.

A solar panel 500' is first manufactured and secondly mounted on a second part 532 of a roof panel 530 to form the car roof 500. Reference numeral 531 denotes a first part.

The first manufactured solar panel 500' includes a solar cell 510, a first encapsulant 541a, and a second encapsulant 542a. The first manufactured solar panel 500' has a structure in which the second encapsulant 542a, the solar cell 510, and the first encapsulant 541a are stacked.

In cases where the solar panel 500' is intended to be secondly mounted on the roof panel 530, a layer of first encapsulant 541b is further added on the first encapsulant 541a, and a substrate 520 is disposed thereon. Also, a layer of second encapsulant 521b is further added under the second encapsulant 542a and adhered to the second part 532 of the roof panel 530.

The car roof 500 includes two layers of first encapsulants 541a and 541b and two layers of second encapsulants 542a and 542b. Thus, the car roof 500 has a structure in which the roof panel 530, the two layers of second encapsulants 542a and 542b, the solar cell 510, the two layers of first encapsulants 541a and 541b, and the substrate 520 are sequentially stacked.

In FIG. 6, reference numeral 50 denotes an electrical connection part and 460 denotes a button ribbon.

Figure 7:
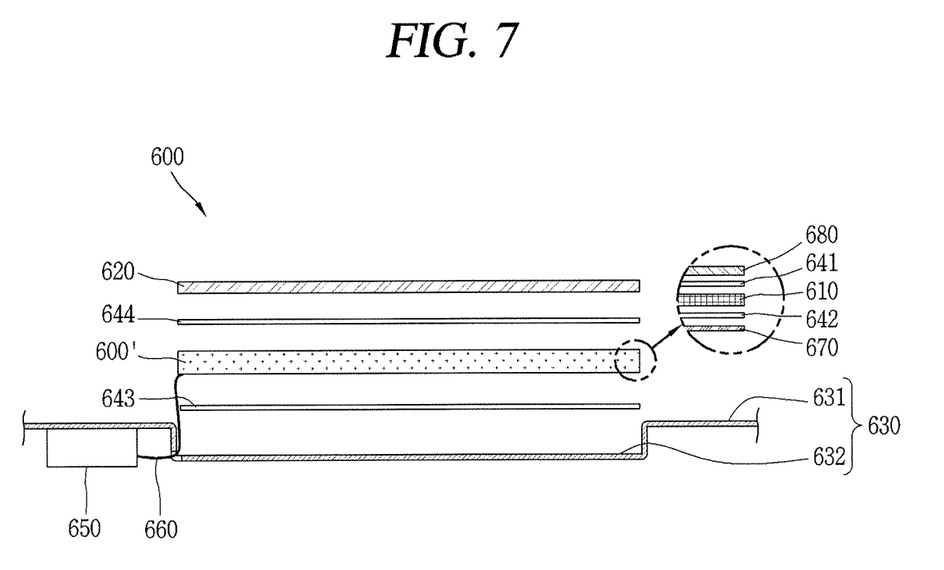
FIG. 7 is a cross-sectional view illustrating another embodiment of a car roof.

FIG. 7 is a cross-sectional view of another embodiment of a car roof 600. A solar panel 600' is first manufactured and secondly mounted on a second part 632 of a roof panel 630 to form the car roof 600. Reference numeral 631 denotes a first part.

The first manufactured solar panel 600' includes a solar cell 610, a film 680, a first encapsulant 641, a second encapsulant 642, and a back sheet 670. The first manufactured solar panel 600' includes the back sheet 670, the second encapsulant 642, the solar cell 610, the first encapsulant 641, and the film 680 from below.

In cases where the solar panel 600' is secondly mounted on the roof panel 630, a fourth encapsulant 644 is further added to the film 680 and a substrate 620 is disposed thereon. Also, a third encapsulant 643 can be further added under the back sheet 670 and the solar cell is adhered to the second part 632 of the roof panel 630. In order to adhere the substrate 620, a lamination process or an autoclave process can be used.

The car roof 600 has a structure in which the roof panel 630, the third encapsulant 643, the back sheet 670, the second encapsulant 642, the solar cell 610, the first encapsulant 641, the film 680, the fourth encapsulant 644, and the substrate 620 are stacked from below.

The solar panel and the car roof described above is not limited to the configuration and method of the embodiments of the present disclosure described above and the entirety or a portion of the embodiments can be selectively combined to form various modifications.

According to the present disclosure described above, since the second substrate of the solar panel corresponds to a roof panel of the car and the car roof includes the roof panel, a separate fixing structure for mechanically fixing the roof panel to the car is not required. That is, the solar panel or the car roof can be installed in the car using the related art configuration in which the roof panel is coupled to a chassis as is.

Also, in the present disclosure, since the second substrate of the solar panel corresponds to the roof panel of the car and the car roof includes the roof panel, a possibility of a defect which may occur during a process of fixing the solar panel or the car roof to the car can be reduced. This is because there is no separate mechanical structure.

Also, in the present disclosure, since the solar cell is directly adhered to the roof panel of the car, the solar cell is not relatively moved with respect to the car. That is, the solar cell is not secondly impacted by an impact applied to the car. Thus, the structure of the present disclosure alleviates an impact due to vibrations applied to the solar cell to secure reliability for a long term.

Also, in the present disclosure, since the encapsulant is adhered to the entire adhering surface of the roof panel, water leak can be solved.

Also, in the present disclosure, since the roof panel of the car protects the solar cell, the solar cell can be stably protected using strength of the roof panel before the solar panel or the car roof is installed on the car.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features can be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A car roof comprising:
    at least one solar cell having a first surface and a second surface facing in mutually opposing directions;
    a substrate disposed on the first surface of the at least one solar cell the substrate including a first lateral side and a second lateral side, the first and second lateral sides being opposed from each other;
    a first encapsulant disposed between the substrate and the at least one solar cell;
    a roof panel disposed on the second surface and forming a roof of a car; and
    a second encapsulant disposed between the roof panel and the at least one solar cell,
    wherein the roof panel includes a steel plate or fiber reinforced plastic,
    wherein the roof panel includes:
        two first parts respectively positioned at the first and second lateral sides of the substrate, the two first parts each being formed of a first surface having a first height and forming an appearance of the car;
        a second part formed of a second surface having a second height lower than the first height of the two first parts;
        two third parts, wherein a first one of the two third parts is connected to a first one of the two first parts and the second part at the first lateral side of the substrate, and a second one of the two third parts is connected to a second of the two first parts and the second part at the second lateral side of the substrate; and
    wherein the second part extends continuously between the first one of the two third parts and the second one of the two third parts;
    wherein the first one of the two third parts faces one side of the at least one solar cell and the second one of the two third parts faces another side of the at least one solar cell,
    wherein the second encapsulant, the at least one solar cell, the first encapsulant, and the substrate are sequentially stacked on the second part and form a multilayer structure,
    wherein the first encapsulant is adhered to an entire adhering surface of the substrate so that no gap is formed between the substrate and the at least one solar cell,
    wherein the second encapsulant is adhered to an entire adhering surface of the roof panel, so that no gap is formed between the roof panel and the at least one solar cell, and
    wherein at least a portion of the roof panel includes a hole, the car roof includes a bus ribbon electrically connected to the at least one solar cell, and the bus ribbon extends through the hole.

2. The car roof of claim 1, wherein the bus ribbon is electrically connected to an electrical connection part.

3. The car roof of claim 1, wherein the substrate includes at least one of glass, polycarbonate (PC), and a transparent sheet.

4. The car roof of claim 1, wherein the roof panel has a curved surface, and
    wherein the second encapsulant, the at least one solar cell, the first encapsulant, and the substrate are sequentially stacked on the second part, form the multilayer structure and each have a curved surface corresponding to the roof panel.

5. The car roof of claim 1, wherein the first encapsulant includes two layers and the second encapsulant includes two layers.

6. The car roof of claim 1, wherein the first encapsulant directly contacts the third part of the roof panel, the substrate and the at least one solar cell, and
    wherein the second encapsulant directly contacts the second part of the roof panel, the third part of the roof panel and the at least one solar cell.

7. The car roof of claim 1, further comprising:
    a back sheet disposed between the second encapsulant and the roof panel; and
    a third encapsulant disposed between the back sheet and the roof panel.

8. The car roof of claim 7, further comprising:
    a film disposed between the substrate and the first encapsulant; and
    a fourth encapsulant disposed between the substrate and the film.

* * * * *